(12) United States Patent
Qian et al.

(10) Patent No.: US 12,542,430 B2
(45) Date of Patent: Feb. 3, 2026

(54) PRESSURE-RESISTANT MEDICAL CABLE ENCLOSURE

(71) Applicant: COVIDIEN LP, Mansfield, MA (US)

(72) Inventors: Weimiao Qian, Shanghai (CN); Yi Zhong, Shanghai (CN); Mingdi Lu, Shanghai (CN)

(73) Assignee: Covidien LP, Mansfield, MA (US)

( * ) Notice: Subject to any disclaimer, the term of this patent is extended or adjusted under 35 U.S.C. 154(b) by 65 days.

(21) Appl. No.: 18/687,254

(22) PCT Filed: Aug. 27, 2021

(86) PCT No.: PCT/CN2021/114972
§ 371 (c)(1),
(2) Date: Feb. 27, 2024

(87) PCT Pub. No.: WO2023/024064
PCT Pub. Date: Mar. 2, 2023

(65) Prior Publication Data
US 2024/0405529 A1    Dec. 5, 2024

(51) Int. Cl.
| | |
|---|---|
| *H05K 5/06* | (2006.01) |
| *A61B 5/1455* | (2006.01) |
| *H02G 3/04* | (2006.01) |
| *H05K 7/14* | (2006.01) |

(52) U.S. Cl.
CPC ....... *H02G 3/0406* (2013.01); *A61B 5/14552* (2013.01); *H05K 5/065* (2013.01); *H05K 7/1427* (2013.01); *A61B 2562/12* (2013.01); *A61B 2562/166* (2013.01); *A61B 2562/222* (2013.01); *A61B 2562/227* (2013.01)

(58) Field of Classification Search
CPC ...................................................... H05K 5/065
See application file for complete search history.

(56) References Cited

U.S. PATENT DOCUMENTS

| | | | | |
|---|---|---|---|---|
| 5,839,439 | A * | 11/1998 | Nierlich | A61B 5/6855 600/338 |
| 2005/0234316 | A1* | 10/2005 | Colvin, Jr. | A61B 5/0031 361/757 |
| 2007/0032707 | A1* | 2/2007 | Coakley | A61B 5/6826 600/344 |
| 2009/0171171 | A1* | 7/2009 | Matlock | A61B 5/00 600/310 |

(Continued)

FOREIGN PATENT DOCUMENTS

| | | |
|---|---|---|
| CN | 101080192 A | 11/2007 |
| CN | 104323756 A | 2/2015 |
| CN | 106356663 A | 1/2017 |

OTHER PUBLICATIONS

International Search Report for PCT Application No. PCT/CN2021/114972, mailed May 26, 2022, 3 pages.

*Primary Examiner* — Hung V Ngo
(74) *Attorney, Agent, or Firm* — Draft Masters IP, LLC

(57) ABSTRACT

A pressure resistant medical cable enclosure is provided, including a clamshell, a printed circuit board, and at least one overmold, wherein the clamshell is configured for assembly over the printed circuit board for a medical cable, one overmold provided at least partially around the clamshell layer with minimal overlap between the overmold and the printed circuit board in the vertical direction.

20 Claims, 5 Drawing Sheets

(56) References Cited

U.S. PATENT DOCUMENTS

| | | |
|---|---|---|
| 2010/0065299 A1 | 3/2010 | Liu et al. |
| 2017/0223846 A1* | 8/2017 | Elolampi ............... H05K 1/181 |
| 2019/0133527 A1* | 5/2019 | Kuisma ............. A61M 25/0012 |
| 2019/0150708 A1* | 5/2019 | Hagihara ............ A61B 1/00124 |
| 2019/0313542 A1* | 10/2019 | Fujioka ................ H05K 3/0014 |

* cited by examiner

PRESSURE-RESISTANT MEDICAL CABLE ENCLOSURE

CROSS-REFERENCE TO RELATED APPLICATIONS

This application is a U.S. National Stage Application of International Application No. PCT/CN2021/114972, entitled "PRESSURE-RESISTANT MEDICAL CABLE ENCLOSURE," filed Aug. 27, 2021, which is hereby incorporated by reference in its entirety for all purposes.

FIELD

The present technology is generally related to a pressure resistant medical cable enclosure, and in particular an improved enclosure for a pulse oximeter.

BACKGROUND

The form factor for many medical devices, including for pulse oximeters, is as a trend, shrinking. Such devices are becoming more and more portable and wearable to accommodate broader patient populations and use environments.

Additionally, certain medical devices or styles of medical devices, including certain pulse oximetry products, utilize cables that provide functionality beyond simple connection, e.g., cables that also provide processing of a signal, access to memory, etc. Indeed, such cables may be able to themselves process physiological signals and output results. However, as the above-described functioning of such cables increases, so does the risk of damage to internal components of the cables that provide increased function.

With reference to Prior Art FIG. 1A and FIG. 1B, current cable designs, for example as shown generally at 100, typically include a mid-layer (e.g., from a premold) 102 and an outer layer (e.g., as an overmold) 104, over an inner layer 106 and a medical circuit board 108 (e.g., a pulse oximetry printed circuit board (PCBA)), along with a cable connector 110 positioned within cavity 112.

Manufacturing of such cable typically includes soldering of the cable to the PCBA, constructing the inner layer with soft material under low pressure molding (to safely encapsulate the PCBA and form the inner layer with a measure of pressure resistance), constructing the mid-layer to shape the sensor gate (connector opening) using a material with a certain hardness for mechanical strength (which may be shaped via a high-pressure molding), and construction of the outer surface. However, in such designs, the inner layer may be too soft to resist added pressure (e.g., the pressure sensitive electrical (EE) components of the PCBA, such as ball grid arrays (BGAs) and the crystal oscillator are still susceptible to damage, particularly during assembly, e.g., during the pre-molding processes, some of which use high-pressure molding), but additionally otherwise during use.

Accordingly, there is a need in the art for improved designs and techniques for protecting internals of medical cables in line with the above.

SUMMARY

This disclosure generally relates to a pressure resistant medical cable enclosure, and in particular an improved enclosure for a pulse oximeter, including a clamshell, a printed circuit board and at least one overmold.

In one aspect, the present disclosure provides a separately molded clamshell mid-layer, configured for assembly over a printed circuit board for a medical cable. In exemplary embodiments, the clamshell includes an opening for injection molding of a soft inner encapsulating material for the printed circuit board.

In further exemplary embodiments, an overmold is provided around at least an end portion of the clamshell structure.

In further exemplary aspects, the overmold does not or minimally overlaps, in a vertical direction, a portion of the printed circuit board to reduce risk of damage thereto during molding.

In further exemplary embodiments, the clamshell piece(s) are provided with contours facilitating bonding with the overmold.

Further, in exemplary embodiments, one or more clamshell pieces are provided with complementary mating structures and/or reinforcing structures.

The details of one or more aspects of the disclosure are set forth in the accompanying drawings and the description below. Other features, objects, and advantages of the techniques described in this disclosure will be apparent from the description and drawings, and from the claims.

BRIEF DESCRIPTION OF DRAWINGS

Prior Art

Prior Art

DETAILED DESCRIPTION

As we have noted above, the present disclosure relates to a pressure resistant medical cable enclosure, and in particular an improved enclosure for a pulse oximeter, including a clamshell an inner layer and at least one overmold configuration.

Figure 1B:
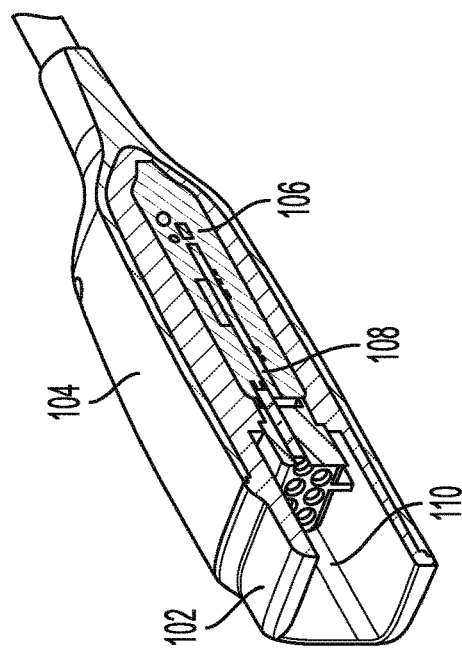
FIG. 1B is a perspective cutaway view of the cable of Prior Art FIG. 1A.
Figure 1A:
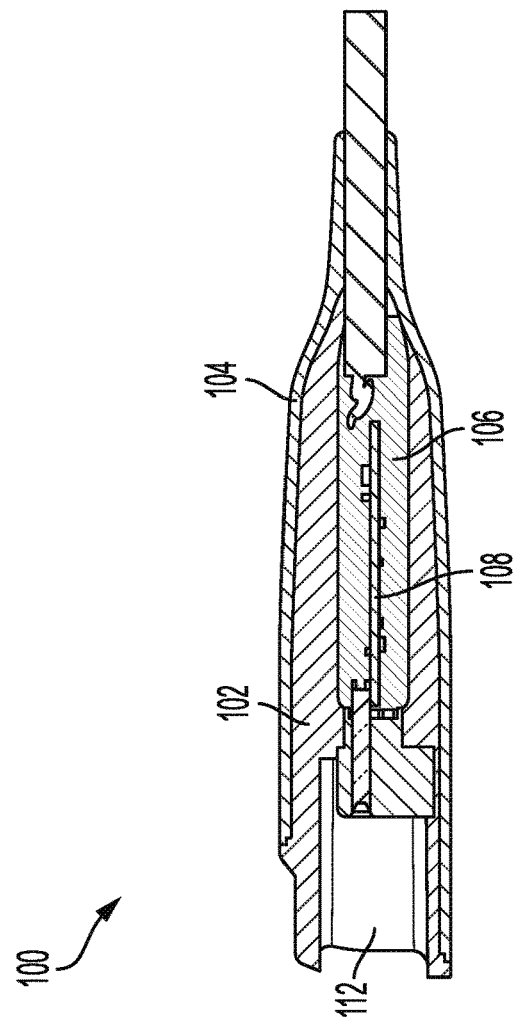
FIG. 1A is a side schematic view of a prior art medical cable.
Figure 2B:
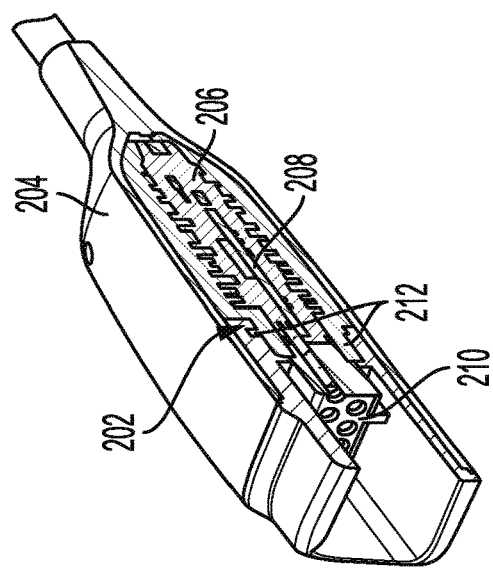
FIG. 2B is a perspective cutaway of the improved cable of FIG. 2A.
Figure 2A:
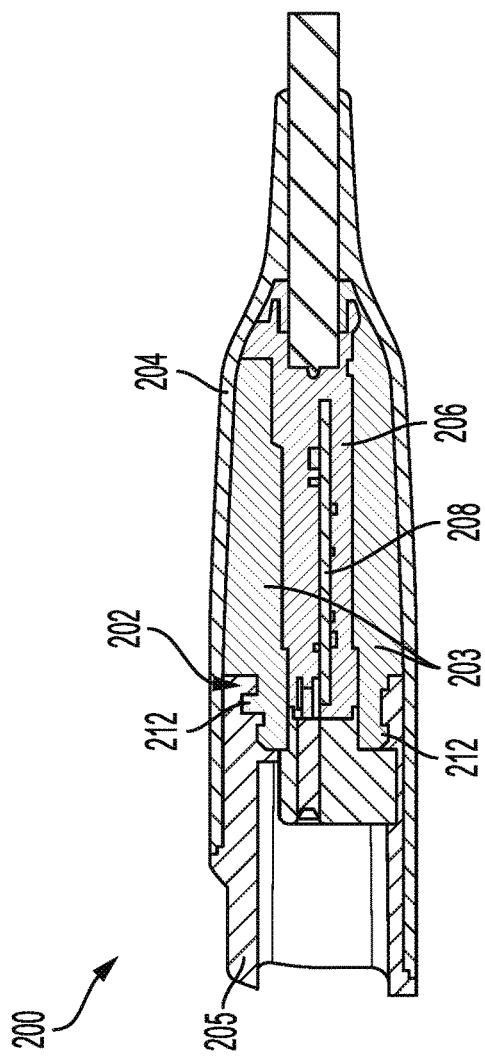
FIG. 2A is a side schematic view of an improved medical cable in accordance with the present disclosure.

FIGS. 2A and 2B illustrate such a cable enclosure generally at 200, including PCBA 208, inner layer 206, and outer layer 204 (e.g., as an overmold). A mid-layer 202, includes a clamshell 203 (including top and bottom shell portions), as well as a mid-layer overmold 205 (molded over the clamshell in at least one location, but optionally over at least one clamshell protrusion 212. In exemplary embodiments, such protrusion(s) increase the bond between the clamshell and the mid-layer overmold and/or increase the overall strength and resiliency of the cable enclosure.

Figure 3:
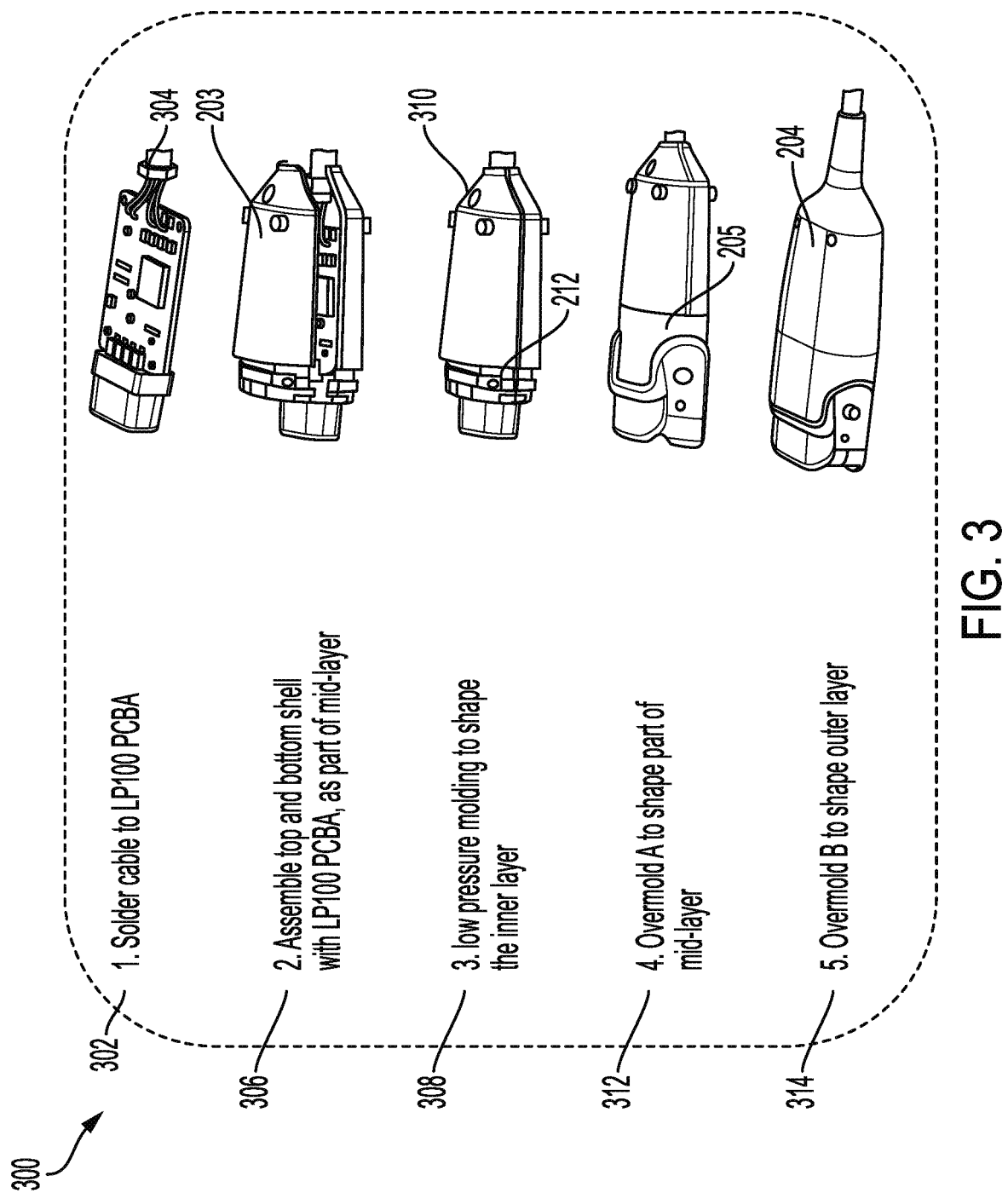
FIG. 3 is an exemplary assembly process and schematic in accordance with the present disclosure.

FIG. 3 illustrates (generally at 300) an exemplary manufacturing process for such a cable enclosure.

At 302, cable conductors 304 are soldered to the PCBA (in this case illustrated as an LP100 PCBA.

At 306, top and bottom clam shell portions 203 are assembled around the PCBA and inner layer 206, as part of the mid-layer. In exemplary embodiments, the clamshell portions 203 at least extend along the length of the PCBA 208. In further exemplary embodiments, the clamshell portions additionally extend past the PCBA 208 and over at least a portion of the connector 210. In further exemplary embodiments, such extension over a portion of the connector is up to about 2 mm, up to about 3 mm, up to about 4 mm, up to about 4.5 mm, up to about 5 mm, between about 4 and 5 mm, etc.

At 308, low pressure molding is provided to shape the inner layer, which is provided through a shell hole channel 310 as a soft material to encapsulate the PCBA.

At 312, a mid-layer overmold 205 is provided over the clamshell 203 (note protrusion(s) 212 on the clamshell 203). In exemplary embodiments, the mid-layer overmold 205 shapes the sensor gate/connector and comprises a material selected with a hardness to provide mechanical strength for connections. In exemplary embodiments, overmold 205 is shaped with high pressure (according to selected material (s)).

At 314, an outer overmold 204 is provided over at least a part of the enclosure (and optionally over the cable).

Figure 4B:
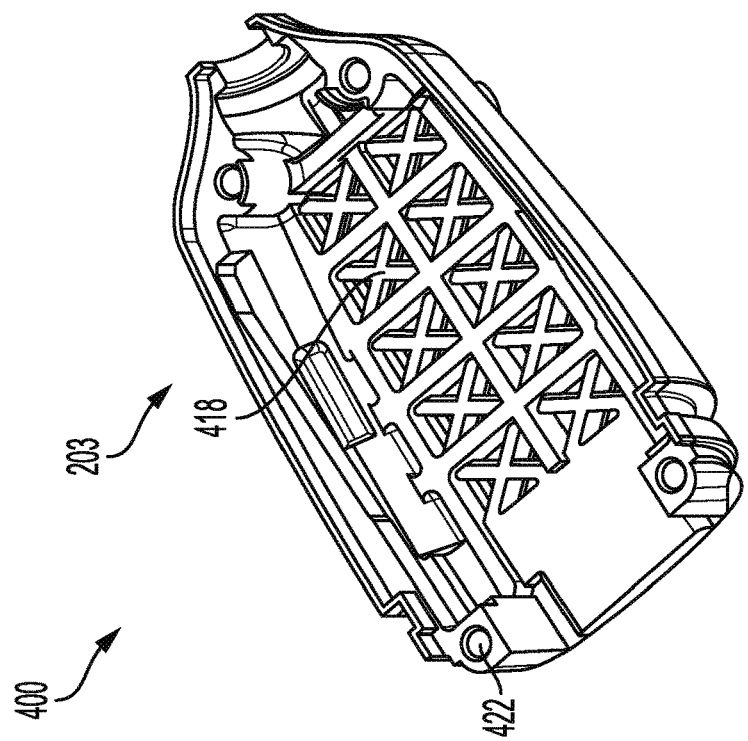
FIG. 4B is a perspective view of second, complementary clamshell structure in accordance with the present disclosure.
Figure 4A:
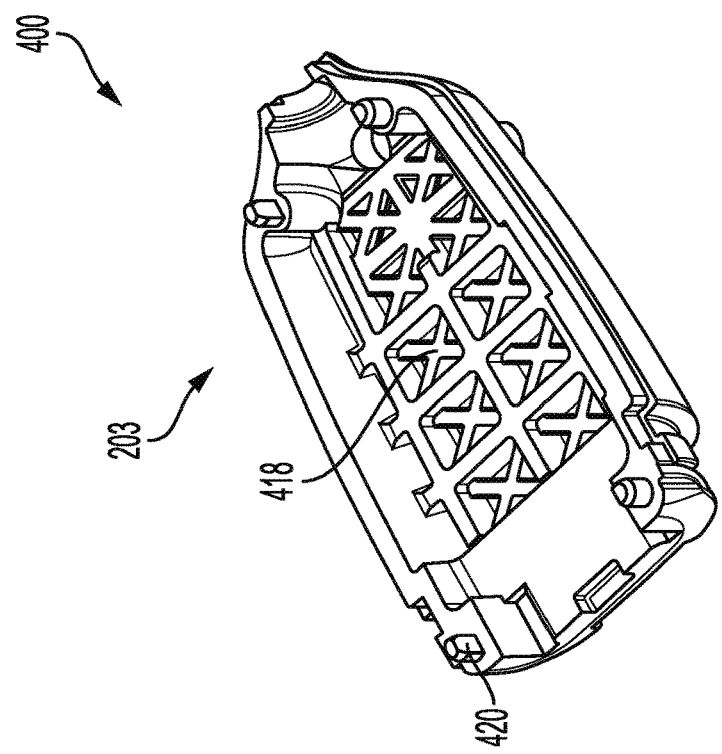
FIG. 4A is a perspective view of first clamshell structure in accordance with the present disclosure.

In exemplary embodiments, the presently described clam shell configuration advantageously provides a pressure-resistant cable enclosure, wherein separate shell pieces are assembled, with injection molding of the shell pieces being separate from assembly with the PCBA. This allows for complex structure shapes, such as the exemplary complementary shell pieces shown in FIG. 4A and FIG. 4B at 400. We note exemplary complementary assembly features, such as pin 420 in hole 422 structures to aid in assembly and with overall strength.

In exemplary embodiments, top and bottom shell components 203 are separately produced as complementary parts and assembled during manufacture of the cable. This allows for the aforementioned complex shapes, such as fins 418 on one or both shell component sides. Further, the materials for the clam shell components 203 can be selected without concern for traditional assembly with a PCBA (because they are separately produced), allowing for higher modulus materials (e.g., polycarbonate (PC) with glass fiber) to be selected for good pressure-resistant ability.

Figure 5:
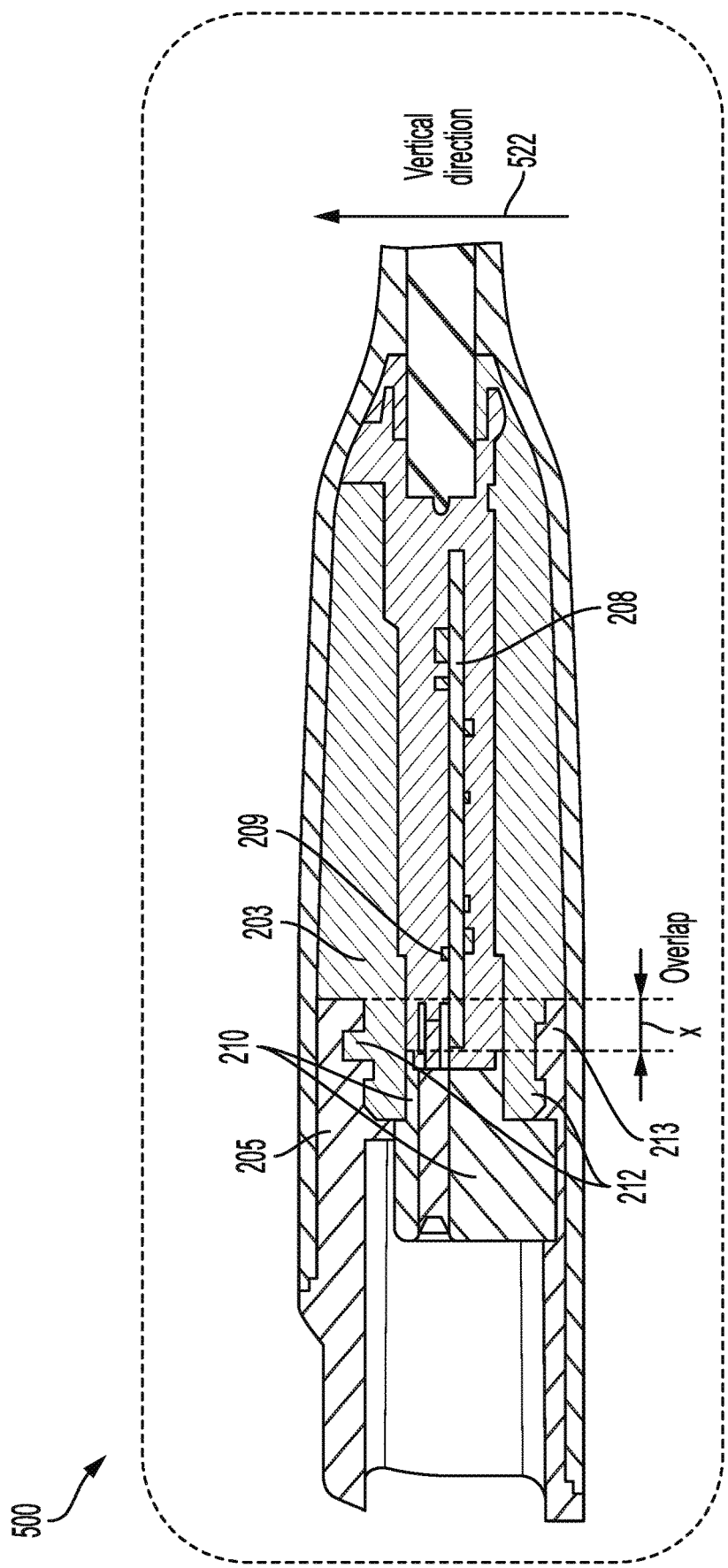
FIG. 5 is a schematic view of a cable enclosure in accordance with the present disclosure.

In further exemplary embodiments, mid-layer overmold 205 is configured with zero to low overlap with the PCBA in the vertical direction. In further exemplary embodiments, such overmold is constructed by an insert molding process. We refer to FIG. 5, which illustrates such an enclosure at 500. In relevant part, overmold 205 is provided with an overlap X with PCBA board 208 in the vertical direction 522. Overlap X may be a zero value (no overlap). In exemplary embodiments a minimal value is slightly more than zero (e.g., 1 millimeter (mm) or less). In other exemplary embodiments, overlap is between zero and 5 mm, between about zero and 4 mm, between about zero and 3 mm, between about zero and 2 mm, between about zero and 1 mm (or any other range with reference to the foregoing, inclusive of between about up to 1 mm and 5 mm. Such exemplary ranges reduce or eliminate the risk that overmolding component 205 (which may be at high pressure) will damage the PCBA 208. We note also optional projection(s) 212, as well as valley(s) 213, which can assist the bond between the overmold 205 and clam shell components 203 and increase overall strength. Additionally, such projection/valley structures may be varied across the profile.

We note that potential overlap between the overmold 205 and the PCBA 208 may also take into account positioning of sensitive components, such as such as ball grid arrays (BGAs) and the crystal oscillator, on the PCBA 208 itself. In further exemplary embodiments, while there may be overlap of the overmold 205 (e.g., up to 5 mm, up to 7 mm or more (e.g., 10 mm) overlap) with the PCBA 208 in general, there is no overlap with any pressure sensitive components (shown e.g., as box 209 in FIG. 5).

We note that the present clamshell construction (203), surrounding the PCBA 208, with the overmold 205 avoids the problems in the prior art with regard to use of a soft material, low pressure molded inner layer to encapsulate the PCBA along with molding a mid-layer thereover to shape the sensor gate, which overmolding (at higher pressure) can damage the PCBA. Indeed, having a clamshell 203 that surrounds the PCBA and optionally a portion of the connector 210 creates a pressure-resistant cable enclosure that reduces or eliminates damage to the PCBA during manufacture and use.

Accordingly, in exemplary embodiments, high pressure transmission of force is reduced and eliminated during manufacture (and during use) according to embodiments described herein, while also allowing for higher strength and more durable connections of components for such manufacture (and use), with the addition, from a manufacturing standpoint, of increasing product yield and lowering defect rates.

It should be understood that various aspects disclosed herein may be combined in different combinations than the combinations specifically presented in the description and accompanying drawings. It should also be understood that, depending on the example, certain acts or events of any of the processes or methods described herein may be performed in a different sequence, may be added, merged, or left out altogether (e.g., all described acts or events may not be necessary to carry out the techniques). In addition, while certain aspects of this disclosure are described as being performed by a single module or unit for purposes of clarity, it should be understood that the techniques of this disclosure may be performed by a combination of units or modules.

What is claimed is:

1. A pressure resistant medical cable enclosure, comprising:
    a cable;
    a printed circuit board, connected to the cable;
    a clamshell layer having an internal cavity configured to surround the printed circuit board and a portion of the cable, the clamshell layer configured with at least two separate clamshell pieces positioned around the printed circuit board; and
    an overmold provided at least partially around the clamshell layer and defining a connection cavity for the printed circuit board, the overmold either not overlapping or only partially overlapping a portion of the printed circuit board in the vertical direction.

2. A cable enclosure in accordance with claim 1, wherein at least one clamshell piece includes an aperture, and wherein a soft, inner layer is provided between the clamshell layer and the printed circuit board via injection of such material through the aperture.

3. A cable enclosure in accordance with claim 1, wherein the overmold overlaps the printed circuit board in the vertical direction up to about 5 mm.

4. A cable enclosure in accordance with claim 1, wherein the overmold does not overlap any pressure sensitive components of the printed circuit board in the vertical direction.

5. A cable enclosure in accordance with claim 1, wherein the overmold is formed around at least one projection formed on an edge of at least one clamshell piece.

6. A cable enclosure in accordance with claim 5, wherein the at least two clamshell pieces include at least one projection, wherein the at least two clamshell pieces extend past the printed circuit board and at least partially over a connector, and wherein the overmold is provided over and around such projections.

7. A cable enclosure in accordance with claim 6, wherein the at least two clamshell pieces include both projections and valleys as contours, and wherein the overmold is provided over and around such contours.

8. A cable enclosure in accordance with claim 1, wherein a second overmold is provided at least partially around the first overmold and the clamshell layer as an outer overmold.

9. A cable enclosure in accordance with claim 1, wherein at least one of the clamshell pieces includes reinforcing structures.

10. A cable enclosure in accordance with claim 1, wherein the clamshell layer comprises polycarbonate with glass fiber content.

11. A method for making a pressure resistant medical cable enclosure, comprising:
providing a cable;
providing a printed circuit board and soldering connections from the printed circuit board to the cable;
assembling a clamshell layer having an internal cavity configured around the printed circuit board and a portion of the cable, the clamshell layer configured with at least two separate clamshell pieces positioned around the printed circuit board; and
forming an overmold provided at least partially around the clamshell layer and defining a connection cavity for the printed circuit board, the overmold either not overlapping or only partially overlapping a portion of the printed circuit board in the vertical direction.

12. A method in accordance with claim 11, wherein at least one clamshell piece includes an aperture, and wherein a soft, inner layer is provided between the clamshell layer and the printed circuit board via injection of such material through the aperture.

13. A method in accordance with claim 11, wherein the overmold overlaps the printed circuit board in the vertical direction up to about 5 mm.

14. A cable enclosure in accordance with claim 11, wherein the overmold does not overlap any pressure sensitive components of the printed circuit board in the vertical direction.

15. A method in accordance with claim 11, wherein the overmold is formed around at least one projection formed on an edge of at least one clamshell piece.

16. A method in accordance with claim 15, wherein the at least two clamshell pieces include at least one projection, wherein the at least two clamshell pieces extend past the printed circuit board and at least partially over a connector, and wherein the overmold is provided over and around such projections.

17. A method in accordance with claim 16, wherein the at least two clamshell pieces include both projections and valleys as contours, and wherein the overmold is provided over and around such contours.

18. A method in accordance with claim 11, wherein a second overmold is provided at least partially around the first overmold and the clamshell layer as an outer overmold.

19. A method in accordance with claim 11, wherein at least one of the clamshell pieces includes reinforcing structures.

20. A method in accordance with claim 11, wherein the clamshell layer comprises polycarbonate with glass fiber content.

* * * * *